（12）United States Patent
Rumberg et al.

(10) Patent No.: US 12,236,179 B1
(45) Date of Patent: Feb. 25, 2025

(54) VARIATION TRIMMING FOR RE-PROGRAMMABLE AND/OR RECONFIGURABLE ANALOG CIRCUITRY

(71) Applicant: ASPINITY, INC., Pittsburgh, PA (US)

(72) Inventors: Brandon David Rumberg, Pittsburgh, PA (US); Nicolas Steven Miller, Pittsburgh, PA (US)

(73) Assignee: ASPINITY, INC., Pittsburgh, PA (US)

( * ) Notice: Subject to any disclaimer, the term of this patent is extended or adjusted under 35 U.S.C. 154(b) by 0 days.

(21) Appl. No.: 18/808,188

(22) Filed: Aug. 19, 2024

Related U.S. Application Data

(60) Provisional application No. 63/520,824, filed on Aug. 21, 2023.

(51) Int. Cl.
*G06F 30/373* (2020.01)
*G06T 7/00* (2017.01)
*G06T 11/00* (2006.01)

(52) U.S. Cl.
CPC .......... *G06F 30/373* (2020.01); *G06T 7/0006* (2013.01); *G06T 11/00* (2013.01)

(58) Field of Classification Search
None
See application file for complete search history.

(56) References Cited

U.S. PATENT DOCUMENTS

| | | | |
|---|---|---|---|
| 7,024,654 B2 * | 4/2006 | Bersch | G06F 30/343 |
| | | | 716/117 |
| 10,088,893 B2 * | 10/2018 | Kulathumani | G06F 1/3296 |
| 10,372,946 B1 | 8/2019 | See | |
| 2002/0055834 A1 | 5/2002 | Andrade et al. | |
| 2016/0019169 A1 | 1/2016 | Snyder | |
| 2022/0180924 A1 | 6/2022 | Snyder et al. | |
| 2022/0207354 A1 * | 6/2022 | Laszlo | G06F 18/211 |

OTHER PUBLICATIONS

"PCT International Search Report and Written Opinion", PCT International Search Authority, dated Dec. 23, 2024, for International Application No. PCT/US2024/042889, 9pgs.
"Compilation Techniques for Reconfigurable Analog Devices", In: Massachusetts Institute of Technology, Sep. 2021, [retrieved on Oct. 8, 2024 (Aug. 10, 2024), Retrieved from the Internet <URL: https://www.researchgate.net/publication/358429461_Compilation_Techniques_for_Reconfigurable_Analog_Devices>, entire document.

* cited by examiner

*Primary Examiner* — Leigh M Garbowski
(74) *Attorney, Agent, or Firm* — Buckley, Maschoff & Talwalker LLC

(57) ABSTRACT

According to some embodiments, re-programmable and/or reconfigurable analog circuitry may be provided. An image interpreter (e.g., a Micro Control Unit ("MCU")) may be configured to receive and store an image, generated for a particular application, to facilitate variation trimming of the re-programmable and/or reconfigurable analog circuitry. The variation trimming may, for example, be performed during production of the re-programmable and/or reconfigurable analog circuitry or post-production of circuitry, in the field, after the circuitry is provided to a customer.

23 Claims, 18 Drawing Sheets

```
Express the network network = Network()
    network.add(
        A0(net="in", mode=Input),
        Opamp(
            pos=Mid,
            neg="vgnd",
            out="out",
            bias=100e-9
        ),
        Resistor(
            kilo="in",
            tap="vgnd",
            mega="out",
        ),
        A1(net="out", mode=Output),
    )

Compile and configure
    dut.load(network)
```

VARIATION TRIMMING FOR RE-PROGRAMMABLE AND/OR RECONFIGURABLE ANALOG CIRCUITRY

FIELD

Some embodiments are associated with variation trimming for analog circuitry. More specifically, some embodiments provide variation trimming for re-programmable and/or reconfigurable analog circuitry, including, in some cases, post-production global reference trimming, coefficient correction, and offset cancellation.

BACKGROUND

Analog circuitry may be provided to perform various applications. For example, analog circuitry might analyze information from a sensor network for a variety of tasks including, e.g., monitoring critical infrastructures such as bridges or monitoring vital signs in biomedical applications. Note, however, that the behavior of parameters associated with analog circuitry (e.g., for a fixed signal chain) will vary from die-to-die. To address this, variation trimming can be performed to correct those errors. Typically, trimming is done during production. When the analog circuitry is re-programmable and/or reconfigurable to perform multiple applications, however, the operating targets may be unknown at production time, requiring many parameters to be trimmed over the space of all applications, which can be a lengthy and relatively expensive process.

Accordingly, methods and mechanisms for accurately and efficiently providing variation trimming may be desired.

DETAILED DESCRIPTION

Disclosed herein are various examples related to re-programmable and/or reconfigurable analog signal processing.

Figure 1:
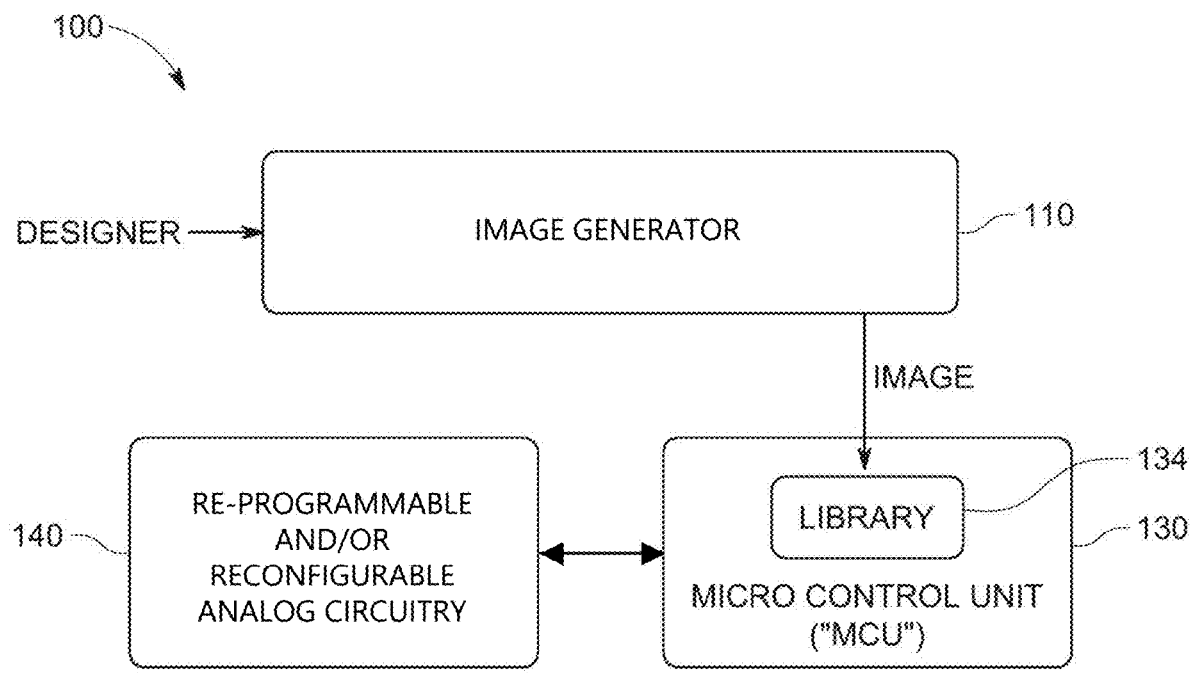
FIG. 1 is a high-level block diagram illustrating an architecture of a system in accordance with some embodiments.

FIG. 1 is a high-level block diagram illustrating an architecture of a system 100 in accordance with some embodiments. The system 100 includes an image generator 110 (e.g., an image containing a whole application design intent in addition to trimming details) that receives application intent from a designer. The image generator 110 may receive, for example, an expression of an analog network associated with a particular application. The image generator 110 generates an image that is interpreted at runtime in an embedded device. The outcome of interpreting the image is to cancel analog parameter variations in a re-programmable and/or reconfigurable analog circuitry 140 (e.g., an analog machine learning processor). An additional outcome may be to configure the analog circuitry 140 to perform the function of a particular analog network. For example, configuration may be provided to a Field-Programmable Analog Array ("FPAA") integrated circuit device containing Computational Analog Blocks ("CABs") and interconnects between the CABs. According to some embodiments, the image interpreter may be a dedicated state machine in the circuitry 140, or the image interpreter may be a firmware library 134 on a Micro Control Unit ("MCU") 130. According to some embodiments, the MCU 130 may be integrated into the analog circuitry 140 or the MCU 130 may be a separate device. The MCU 130 may provide additional functionality such as processing the information received from the analog circuitry 140. Although some embodiments described herein are implemented using an FPAA, note that embodiments may be implemented using any other type of re-programmable analog circuitry 140.

Figure 2:
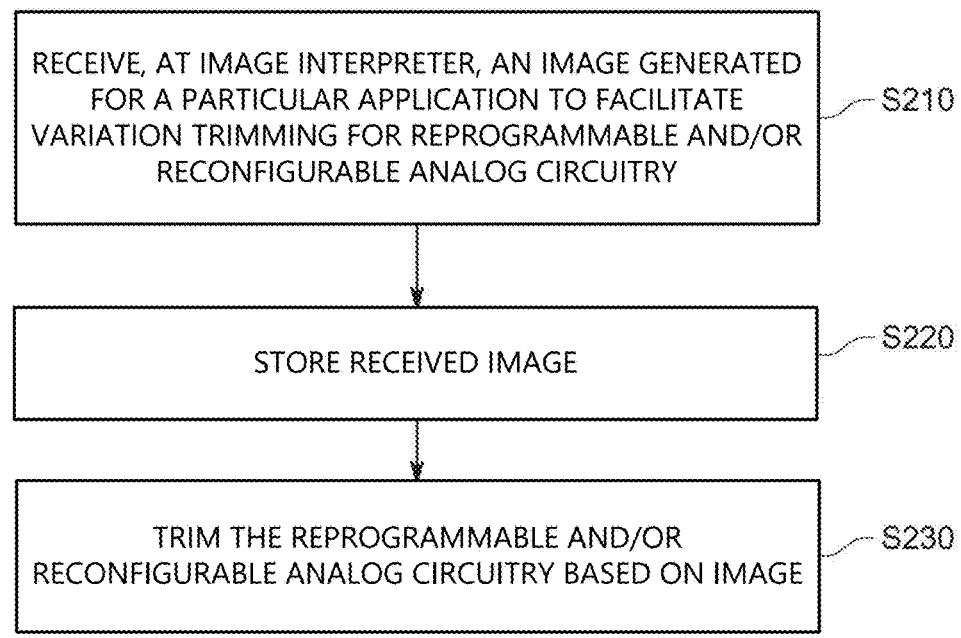
FIG. 2 is a variation trimming method according to some embodiments.

FIG. 2 is a variation trimming method according to some embodiments. At S210, an image interpreter may receive an image generated for a particular application to facilitate variation trimming of re-programmable and/or reconfigurable analog circuitry (e.g., including offset variations, gains, peripherals, etc.). According to some embodiments, the variation trimming is performed during production of the re-programmable and/or reconfigurable analog circuitry. In other embodiments, the variation trimming is performed post-production of the re-programmable and/or reconfigurable analog circuitry (e.g., in the field, after the circuitry is provided to a customer). At S220, an MCU may store the received image and then trim the re-programmable and/or reconfigurable analog circuitry based on the image at S230.

Note that embodiments described in this disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should also be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Figure 3:
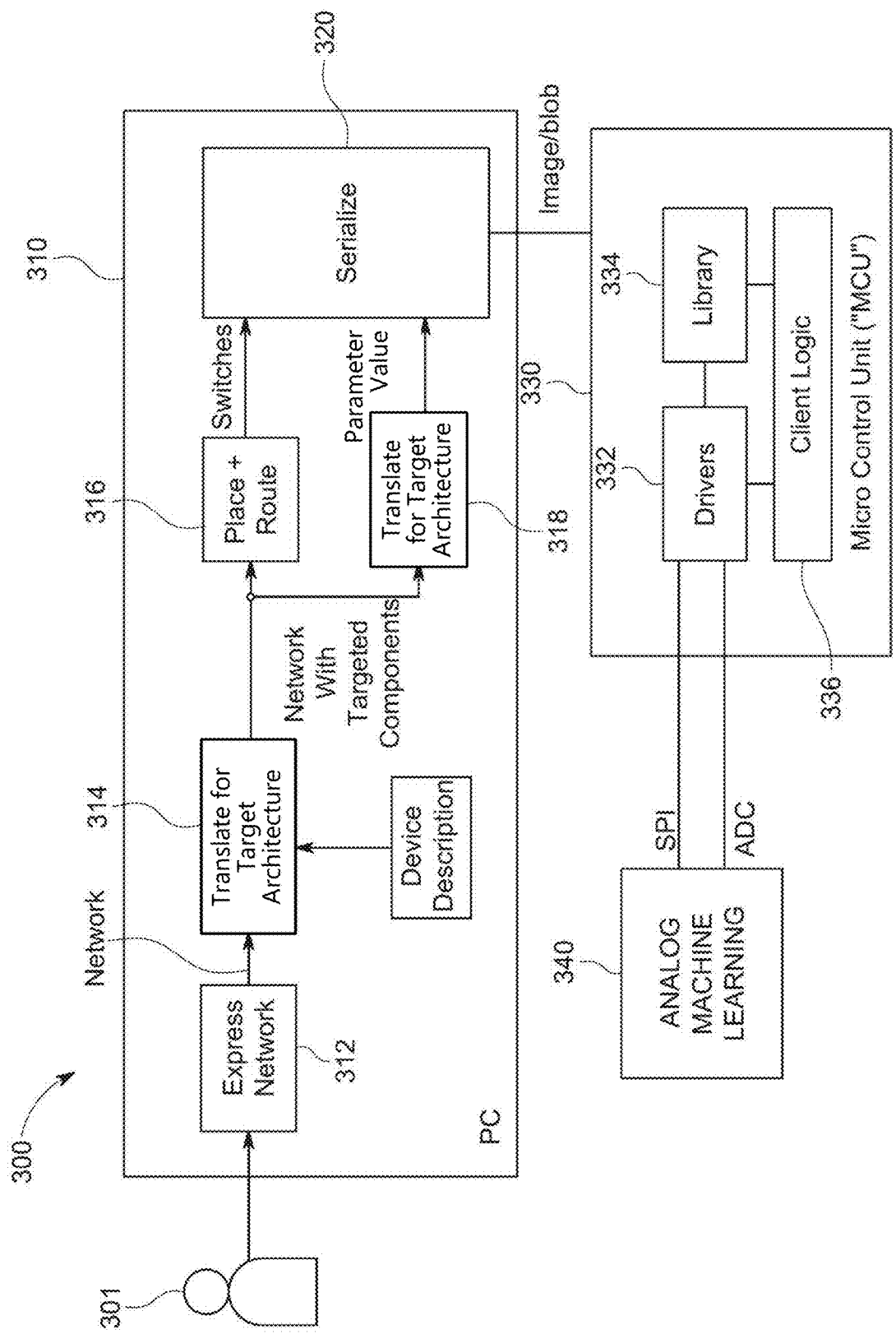
FIG. 3 is a more detailed system in accordance with some embodiments.

FIG. 3 is a more detailed system 300 in accordance with some embodiments. As before, the system 300 includes an image generator 310 (e.g., software running on a Personal Computer ("PC")) that receives information from a designer 301. The image generator 310 may receive, for example, an expression of an analog network 312 associated with a particular application. A translation element 314 may then synthesize an equivalent network from analog elements targeted for a specific device architecture based on device description data. The expression of the network 312 might be associated with, for example, a signal chain, a non-linear signal chain, and/or a child network. Moreover, the network may have terminals, parameters (e.g., a gain), and properties (e.g., an option for inversion or non-inversion).

The image generator 310 places and routes 316 elements of the network to determine which switches to set and translates the network's parameter values into analog circuit parameters 318. Note that a Non-Volatile Memory ("NVM") may store analog parameter values, and, for mature Complementary Metal-Oxide-Semiconductor ("CMOS") devices, NVM may be the best choice. For more advanced process nodes, other memories might be better. The switches and parameter settings may then be serialized 320 to generate an image for the particular application that is provided to an MCU 330. The image for the particular application might comprise, for example, a binary blob file that describes a configuration for the network. The image may then be interpreted by a firmware library 334 on the MCU 330. The image may be stored on the device or received via over-the-air updates. A re-programmable analog processor 340 may also provide information to the MCU 330. For example, the MCU 330 may contain drivers 332 associated with Serial Peripheral Interface ("SPI") and Analog-to-Digital Converter ("ADC") information received from the re-programmable analog processor 340. These drivers may be separated from the firmware library for cross-platform reuse. In some embodiments, interfaces such as I2C, QSPI, UART, UCIe, or AMBA may replace the SPI interface. Client logic 336, coupled to the library 334 and drivers 332, may then provide, for example, in-the-field programming and variation trimming for a reconfigurable analog/mixed signal platform, such as an FPAA integrated circuit device. The variation trimming may be associated with, for example, a global value, such as reference voltages $V_{REF}$, reference currents $I_{REF}$, write and erase rates, etc. Moreover, variation trimming might be associated with amplifier gains, neural net weights, filter frequency, pulse duration, etc. Furthermore, variation trimming might be associated with dc offset accumulation throughout a network.

Figure 4:
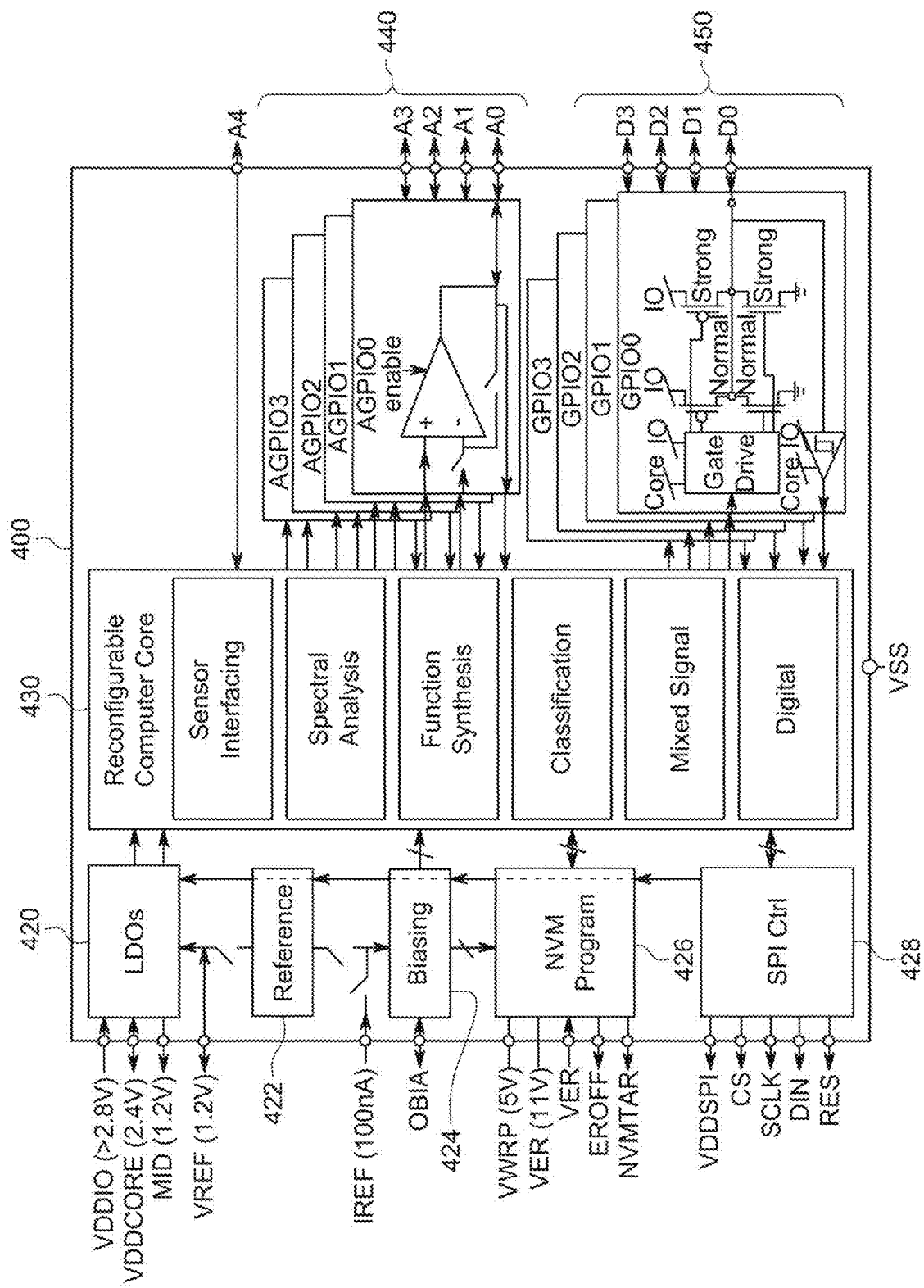
FIG. 4 is a block diagram of an example of analog circuitry according to some embodiments.

FIG. 4 is a block diagram of an example of analog circuitry 400 according to some embodiments. The circuitry 400 includes Low Drop-Out ("LDO") regulators 420, reference generators 422, biasing 424, an analog NVM programmer 426, and SPI control 428. Moreover, a reconfigurable analog computer core 430 may include sensor interfacing, spectral analysis, function synthesis, classification, mixed-signal processing, digital processing, etc. Finally, the circuitry 400 may include General Purpose Input Output ("GPIO") interfaces 440, 450.

Figures 5, 6:
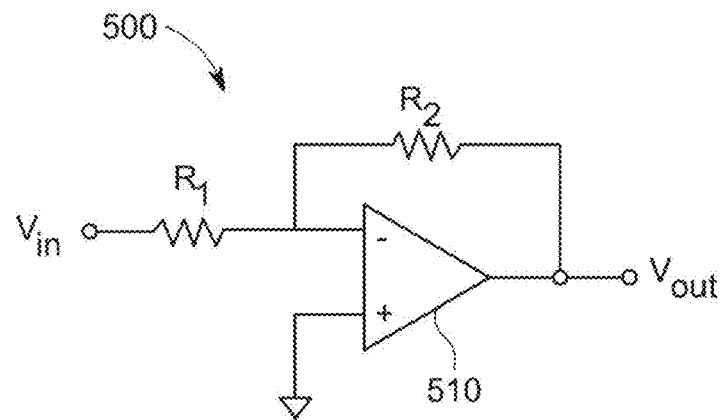
FIG. 5 illustrates a simple network in accordance with some embodiments.
FIG. 6 illustrates the network of FIG. 5 after being expressed according to some embodiments.

Note that the circuitry 400 of FIG. 4 is provided only as one example of a re-programmable and/or reconfigurable analog device. FIG. 5 illustrates a simple network 500 that may be configured into a reconfigurable analog device in accordance with some embodiments having an operational amplifier 510. According to some embodiments, a high-level programming interface can be used to dynamically configure analog circuits with patterns of interest. The programming interface can be implemented on a user device such as, e.g., a smart phone, tablet or computer. The high-level programming interface can assist in the design and configuration of the analog circuits for different applications that involve sampling and processing data from embedded sensors and where the devices being used are energy-constrained. Examples of applications include, but are not limited to: (i) remote monitoring using sensor networks (monitoring of critical infrastructure, monitoring of critical assets and national borders such as, e.g., pipeline monitoring, bridge monitoring, landslide detection and warning, etc.), (ii) monitoring of patient health using embedded medical sensors, (iii) sensing and pattern recognition applications deployed on mobile devices such as handheld smart phones, tablets, and iPads, (iv) a human voice based wakeup of energy constrained devices like smart phones, smart watches and smart eyewear.

Figure 7:
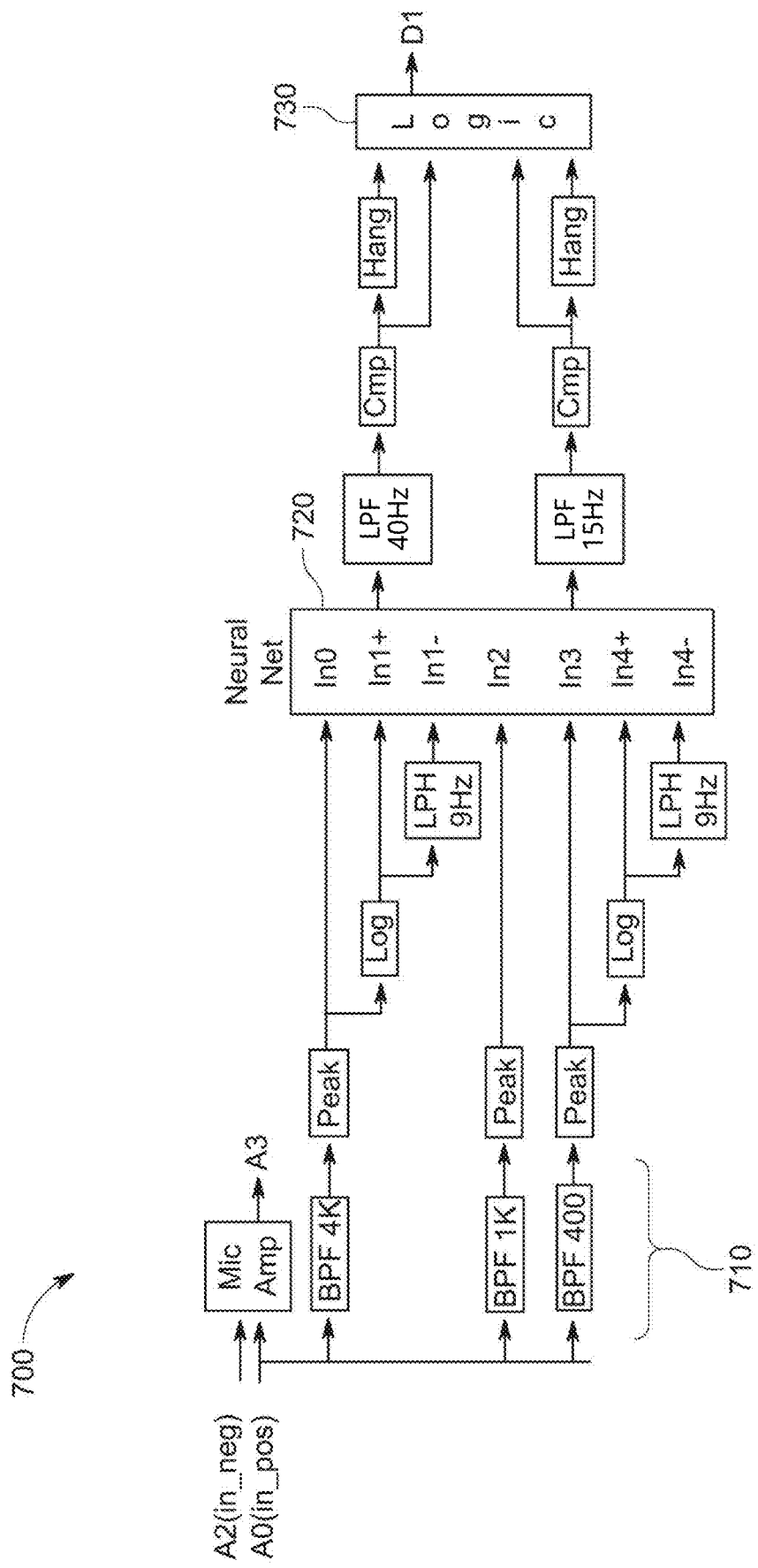
FIG. 7 is a signal chain in accordance with some embodiments.

The high-level programming interface may be used to create an expression of the network 500. For example, FIG. 6 illustrates 600 the network 500 of FIG. 5 after being expressed according to some embodiments. The expression includes pin inputs and outputs, operational amplifier 510 details, information about resistors (e.g., $R_1$ and $R_2$), etc. Once the expression is completed, the network can be compiled and configured 610. In some embodiments, the network may be associated with a signal chain. For example, FIG. 7 is a signal chain 700 in accordance with some embodiments. The signal chain 700 includes Band Pass Filters ("BPF") 710, a neural net 720, and output logic 730. The analog circuit elements in the signal chain 700 may have analog parameters, e.g., center frequencies of BPFs and weights of neural net neurons. The values of these analog parameters are expressed in the network 312, translated to architecture-specific values 318 and communicated to the reprogrammable analog device via the image generator 320. The analog parameters are ultimately stored in the reprogrammable analog device and applied to the analog circuit elements in the signal chain. In some embodiments, the analog parameters may be stored in nonvolatile analog memory elements (such as a floating-gate transistor that stores an analog charge value). Other embodiments may store representations of the analog values in digital registers and apply those values to digital-to-analog converters to control the analog circuit elements. Regardless, the analog parameter control is reprogrammable, allowing modification of the parameter values to compensate for manufacturing variation.

Note that parameter variation is common in analog parts (in general). As a result, parts may be trimmed at final test during production. Embodiments described herein may perform trimming based on a particular application (e.g., during production or in the field after delivery of the part to the customer). Such an approach may allow for an improved quantity and range of analog parameterization. Moreover, the parameters may be application-dependent, modifiable in the field, and/or modifiable by the user. Note that generic parameters might be trimmed at final test and stored in a NOR flash inside the reprogrammable analog device or be trimmed during load in the field. Embodiments might be associated with, for example, global and/or peripheral variation such as $V_{REF}$, $I_{REF}$, and analog NVM programming (e.g., a control DAC write and erase rates that might be associated with charge pump variation or the floating gates themselves).

Figure 8:
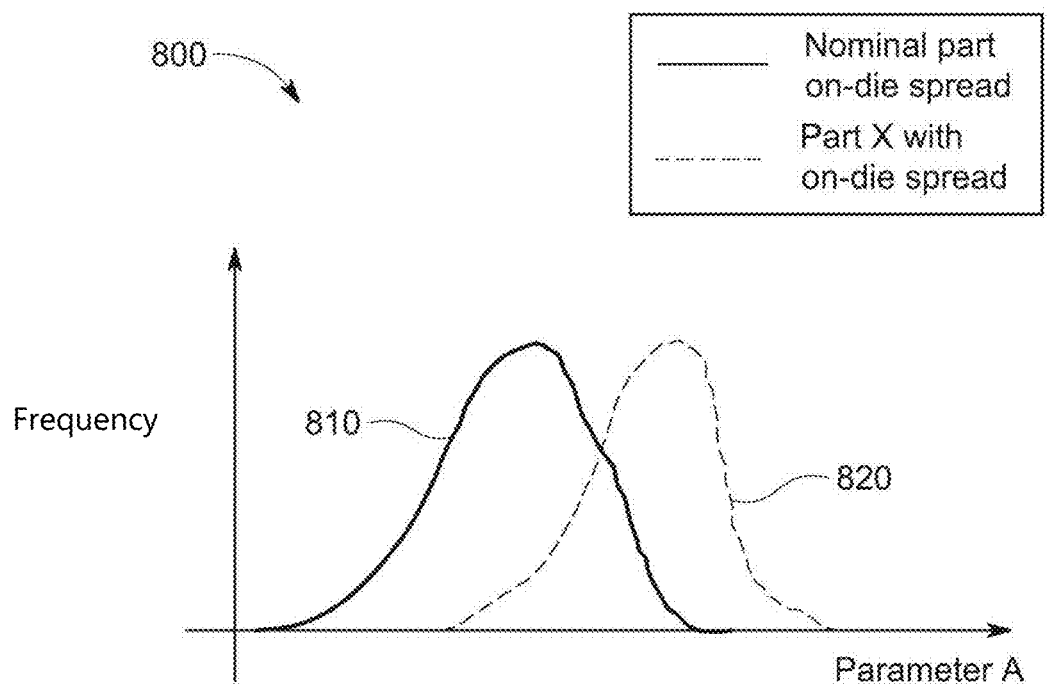
FIG. 8 is a graph showing on-die spread for parameter A according to some embodiments.
Figure 9:
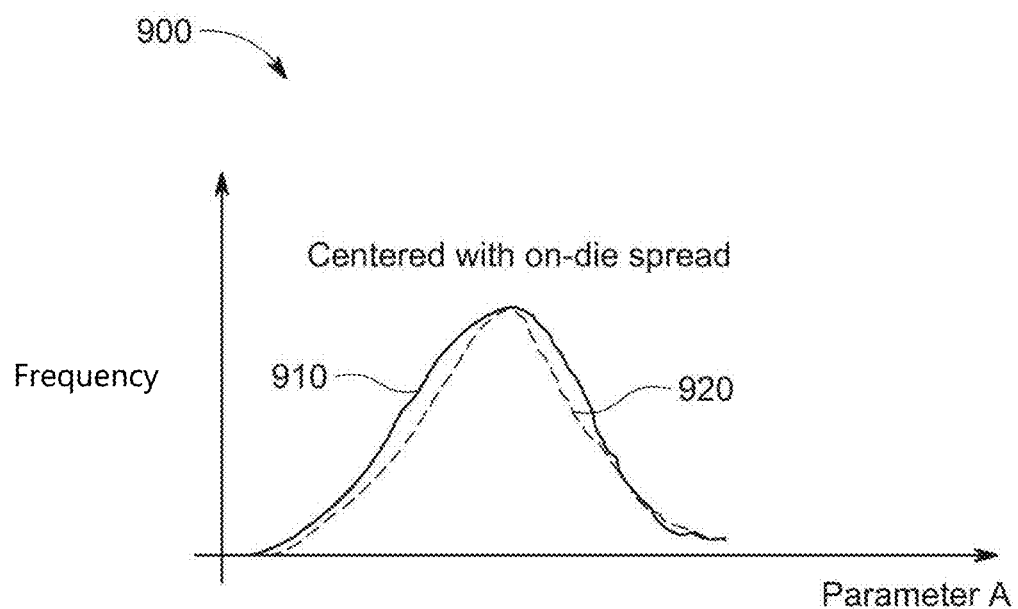
FIG. 9 is a graph showing a centered spread for parameter A in accordance with some embodiments.
Figure 10:
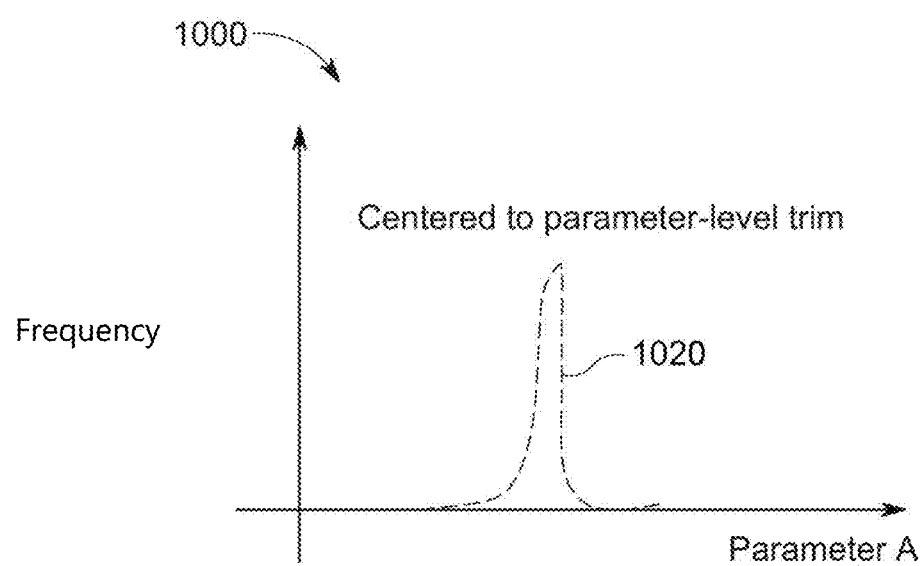
FIG. 10 is a graph showing trimmed spread for parameter A according to some embodiments.

For example, FIG. 8 is a histogram graph 800 showing on-die spread for parameter A according to some embodiments. The graph 800 shows a shift for parameter A between a nominal part on-die spread 810 (shown by a solid line in FIG. 8) and a particular part X on-die spread 820 (shown by a dashed line in FIG. 8). Trimming global and/or peripheral variation "centers" the part X. For example, FIG. 9 is a histogram graph 900 showing a centered spread for parameter A in accordance with some embodiments. The graph 900 shows that the difference between the nominal part on-die spread 910 (shown by a solid line in FIG. 9) and part X 920 (shown by a dashed line in FIG. 8) has been greatly improved. Since these may be common across all use cases, the operations might not be application-specific according to some embodiments (and can be performed at final test and stored). Note that write and/or erase rates may be temperature or aging dependent (and thus could be retrimmed at load time). The trimming might be associated with various component-level parameters (or "coefficients"), such as a neural net weight, a filter center frequency, etc. For example, FIG. 10 is a histogram graph 1000 showing post-trim variation reduction 1020 for parameter A according to some embodiments. Component-level parameter coefficients may also be common across use-cases (allowing for characterization and storage at final test) except that the operating range of interest varies with application.

With respect to stateless coefficient parameters, such as amplifier gains and neural net weights, these might be trimmed in the field at load time according to some embodiments. With respect to stateful parameters (e.g., filter frequency and pulse duration), these may be relatively slow (since they inherently have time constants that require more time to measure) and, as a result, might be characterized at final test and stored in NOR flash inside the analog device to reuse in the field. With respect to signal chain offsets, offsets may accumulate through a sequence of elements in a signal chain. Linear circuit elements may be unaffected by offsets if the offsets are small enough that signals remain in the linear range. However, nonlinear circuit elements may be strongly affected by offsets. For example, in a comparator element, an offset may cause the opposite response from what is desired. Or in a logarithm circuit element, an offset may shift a positive input to be negative, which is undefined for logarithm operation. These offsets may be dependent on the signal chain and parameters (which may be unknown prior to delivering to the customer) and, as a result, the offset correction process might be performed in the field.

Figure 11:
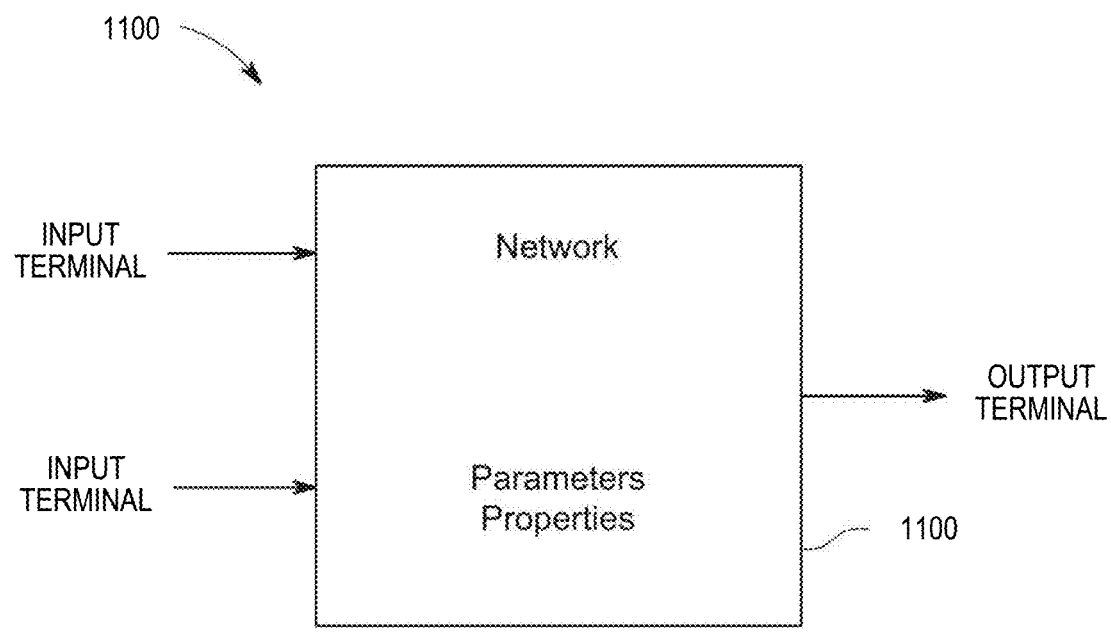
FIG. 11 is a network with terminals and parameters/properties according to some embodiments.
Figure 12:
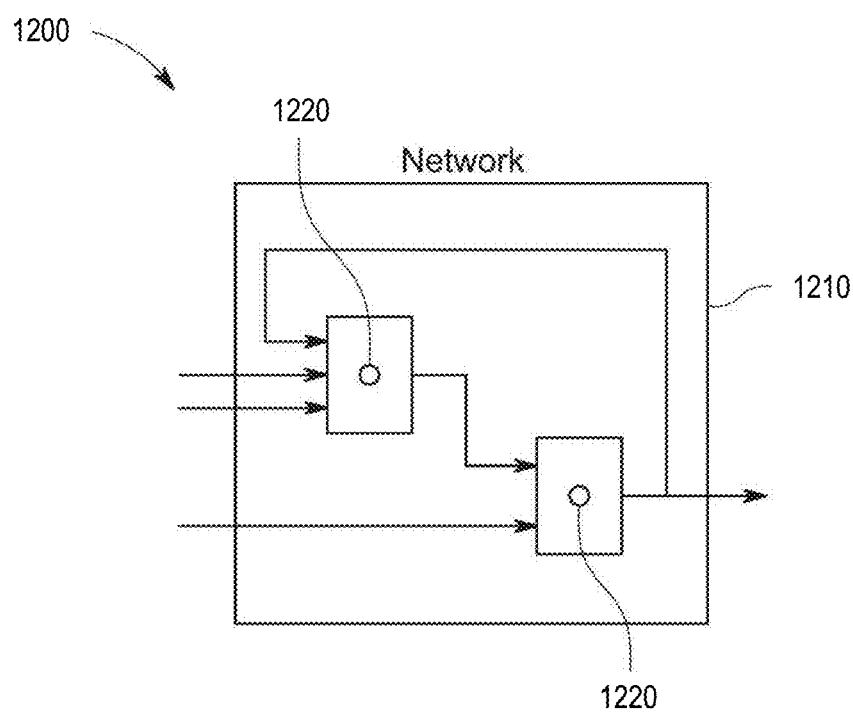
FIG. 12 illustrates child networks in accordance with some embodiments.
Figure 13A:
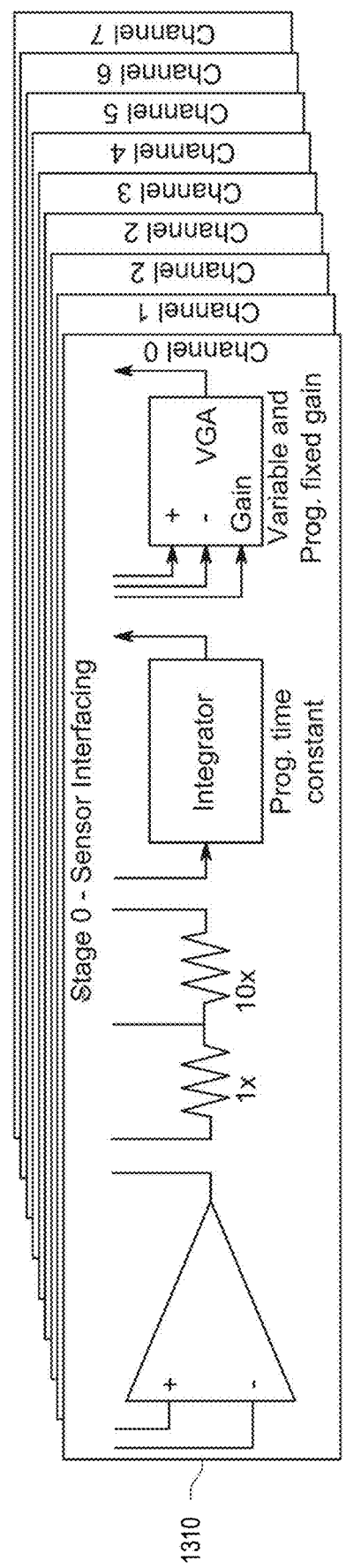
FIGS. 13A through 13H show a device according to some embodiments.
Figure 13B:
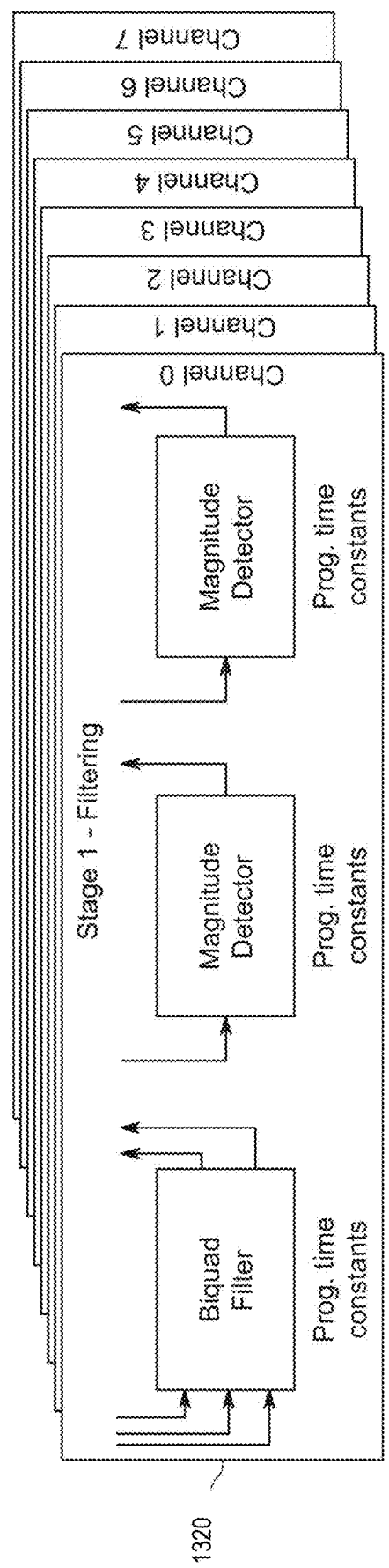
Figure 13C:
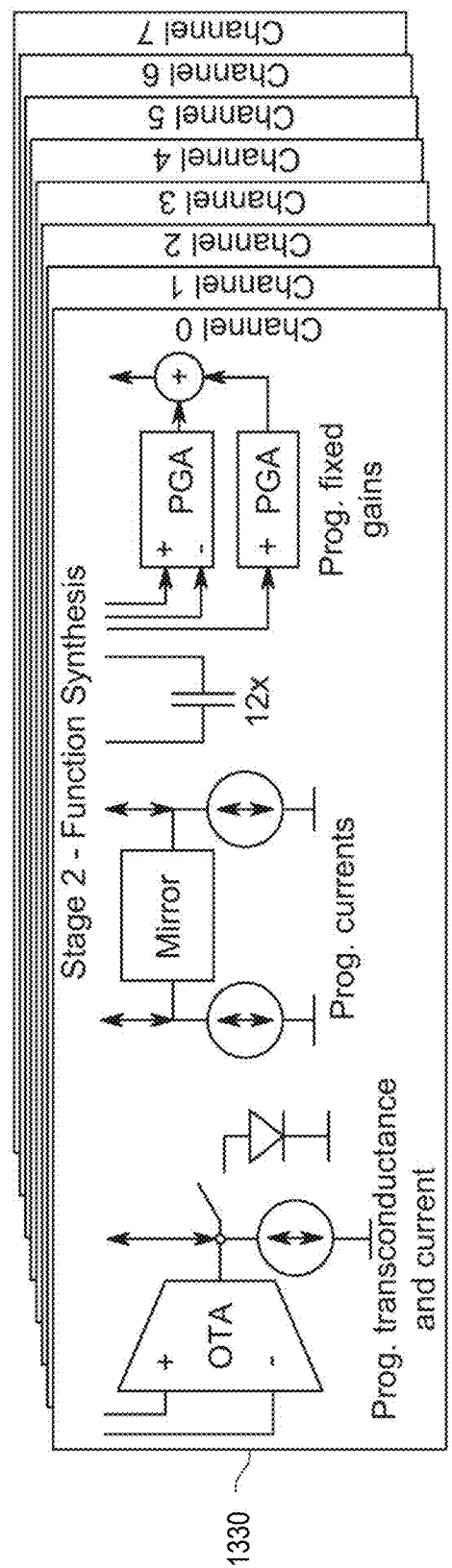
Figure 13D:
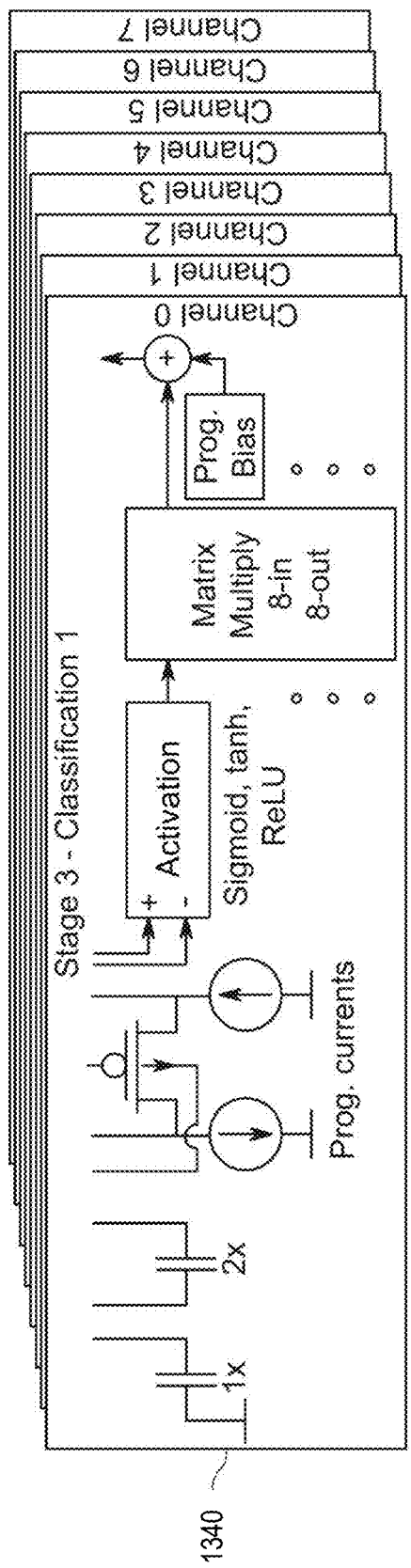
Figure 13E:
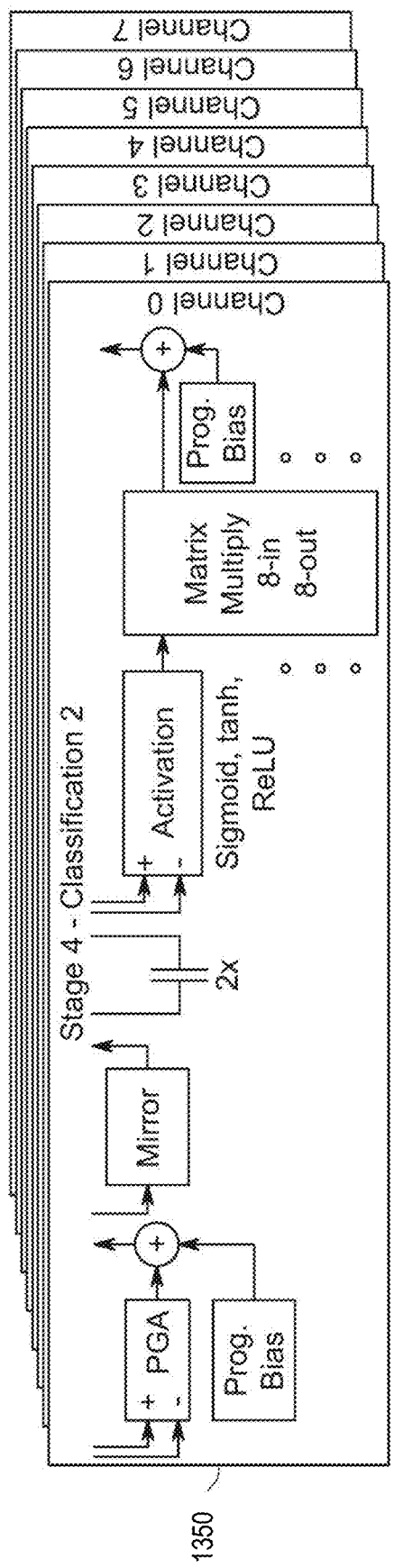
Figure 13F:
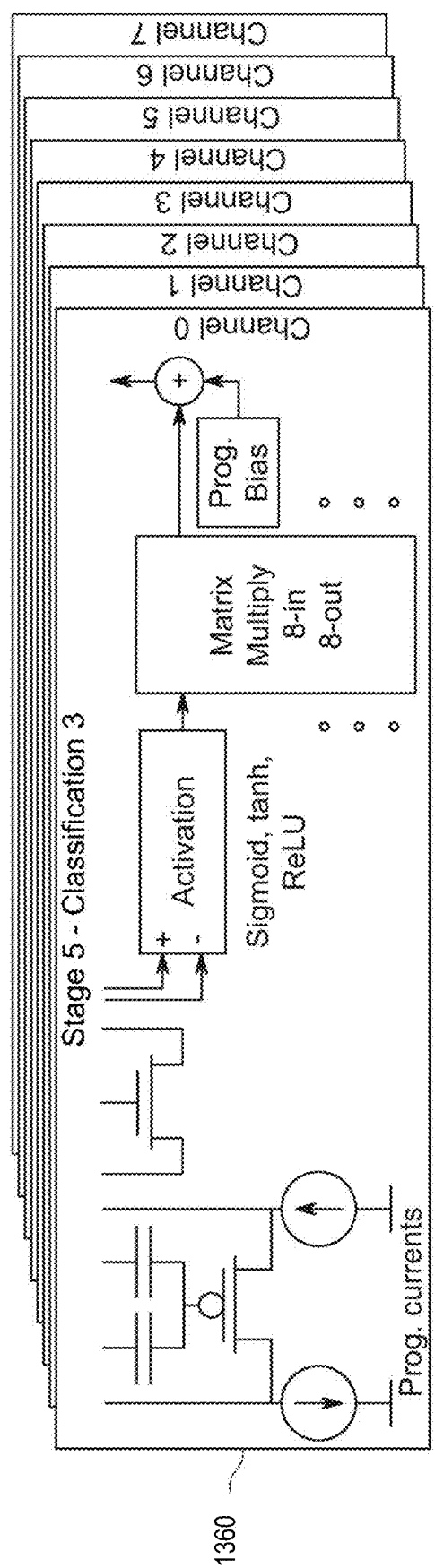
Figure 13G:
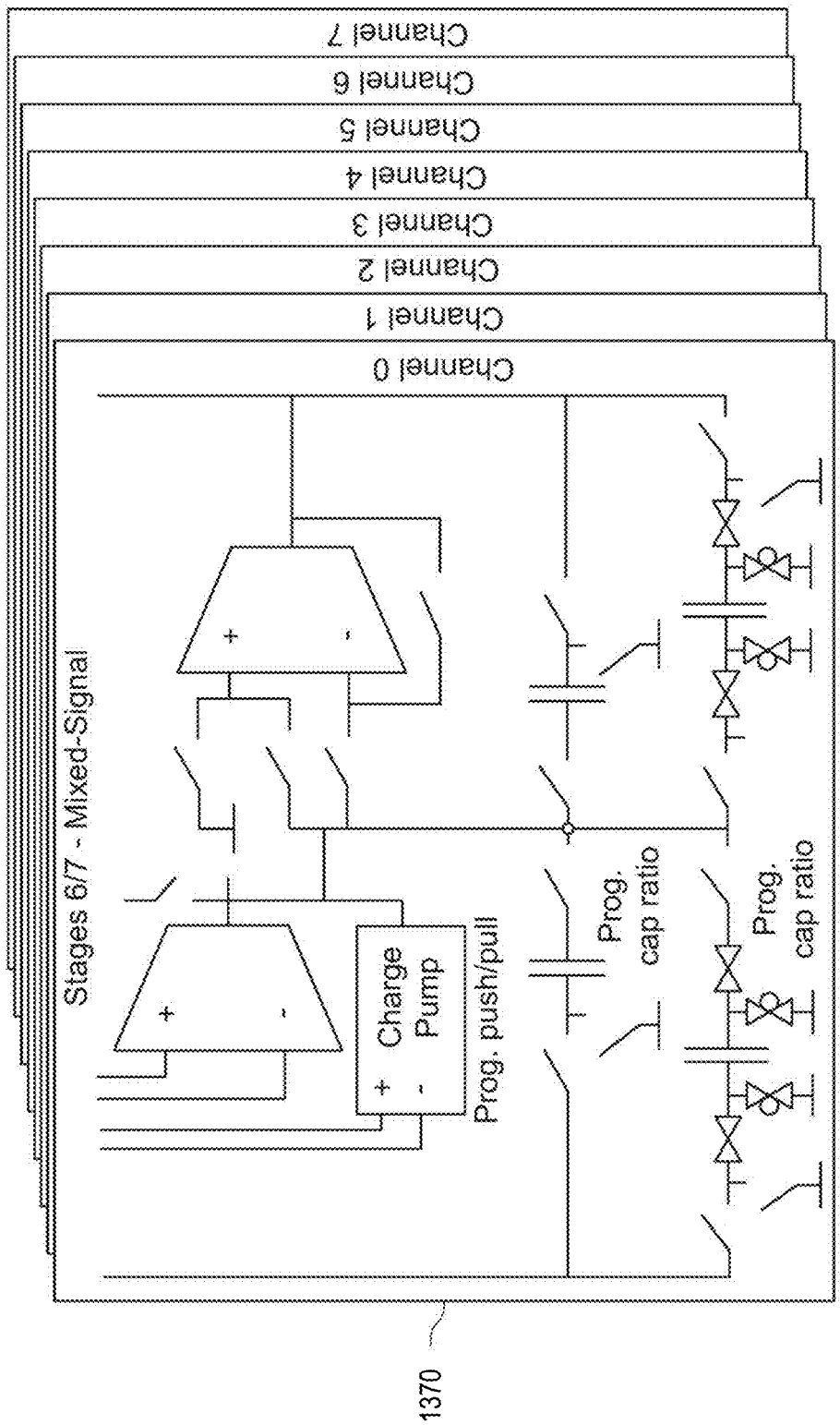
Figure 13H:
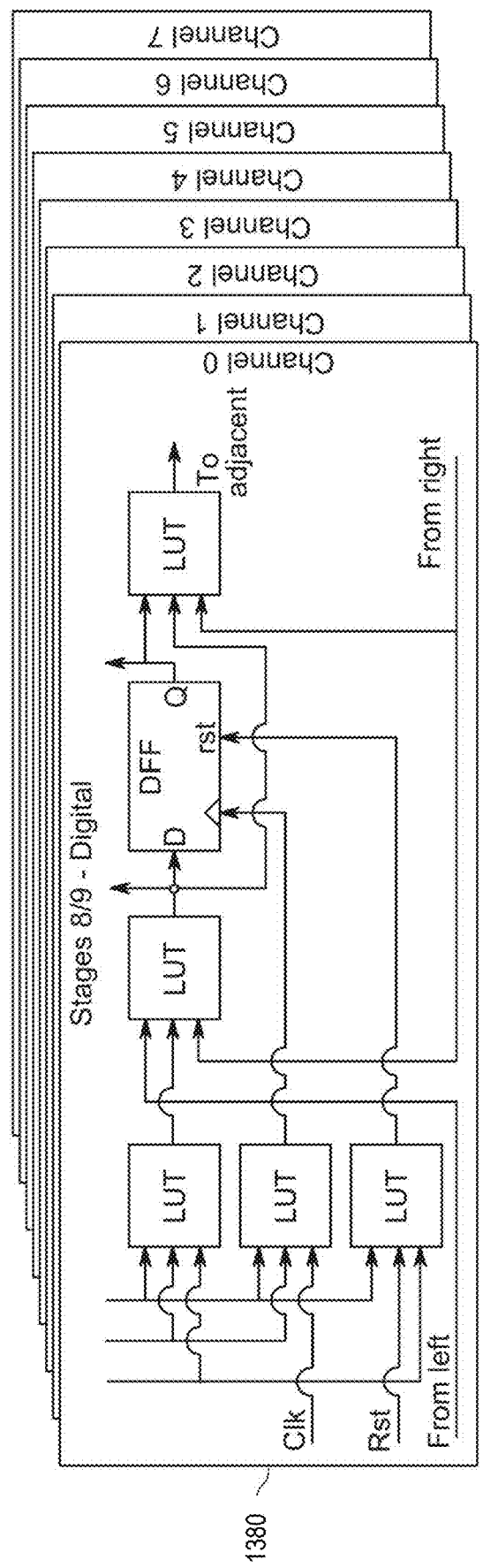

A network and/or application may be expressed using terminals, parameters, and/or properties. For example, FIG. 11 illustrates 1100 a network 1110 with input/output terminals and parameters/properties according to some embodiments. The network's parameters might include coefficients like, for example, gain while the network's properties might include discrete options, for example an inverting or non-inverting indication. According to some embodiments, a network can be composed of child networks. For example, FIG. 12 illustrates 1200 a network 1210 that includes multiple child networks 1220 in accordance with some embodiments. The lowest-level child networks 1220 may comprise components that correspond to physical circuits (circuits actually in the reconfigurable analog device) or "virtual" components that are simulated. With respect to Application Programming Interface ("API") examples, the network 1210 may be generic and independent of a target device. Note that there may be multiple ways to implement the network 1210 and the output of the network 1210 may be composed of components for the target. When translating a network to a target, note that the target can be a variant of the reconfigurable analog device, the simulator, and/or a machine learning framework. With respect to a device description, it may consist of a set of components (with terminals, parameters, and properties) that include pins (note that different devices may have different sets of components), a switch matrix (with wires, including terminals of components, and switches), and/or peripherals.

FIGS. 13A through 13H show a device according to some embodiments. The device includes a sensor interfacing stage 1310 (for eight separate channels 0 through 7), a filtering stage 1320, and a function synthesis stage 1330. The device further includes a first classification stage 1340, a second classification stage 1350, and a third classification stage 1360. There are also mixed-signal stages 1370 and digital stages 1380. A translation process may recurse through a network tree and adjust for a target device architecture. The recursion may include decisions about which components to use, translating parameters to electrical quantities (e.g., charge deltas on analog NVM), assigning references for temperature compensation, etc. Placing components may involve selecting an address (stage and channel) for each component to minimize net lengths. Routing components may involve selecting switches to connect terminals in a way that minimizes net lengths. The system may also tie off unused input terminals and determine which I/O pins are inputs and outputs. After encoding and serialization, the resulting image is a binary blob that describes the configuration (switches, analog parameters, and peripherals). The image may be, for example, sent over the wire or compiled into a firmware library (e.g., delivered as a compiled library (e.g., for ARM® Cortex-M MCUs) to customers). The firmware library may include additional logic to configure and trim a re-programmable and/or reconfigurable analog device or additional application-specific functions to sequence behavior and evaluate data received from the programmable analog device.

A configuration process may start with a reset, which may clear the switches, set the peripherals to default values, and/or tie off floating input terminals. The system can then erase and write analog NVM, finalize peripherals, and write switches. To compile for trimming, the system may generate an image with everything needed to perform trimming in the field. The image may contain:

gains, such as a parameter NVM address and target gain;
offsets, such as upstream switch configuration (to set switches to probe offset contributors), self-measurement switch configuration (to measure self-offset), equation to compute target offset, corresponding sign bits that affect the offset polarity; and
top-level network configuration, such as top-level NVM (e.g., "under-programmed" to leave room for unidirectional correction) and top-level switches.

Figure 14:
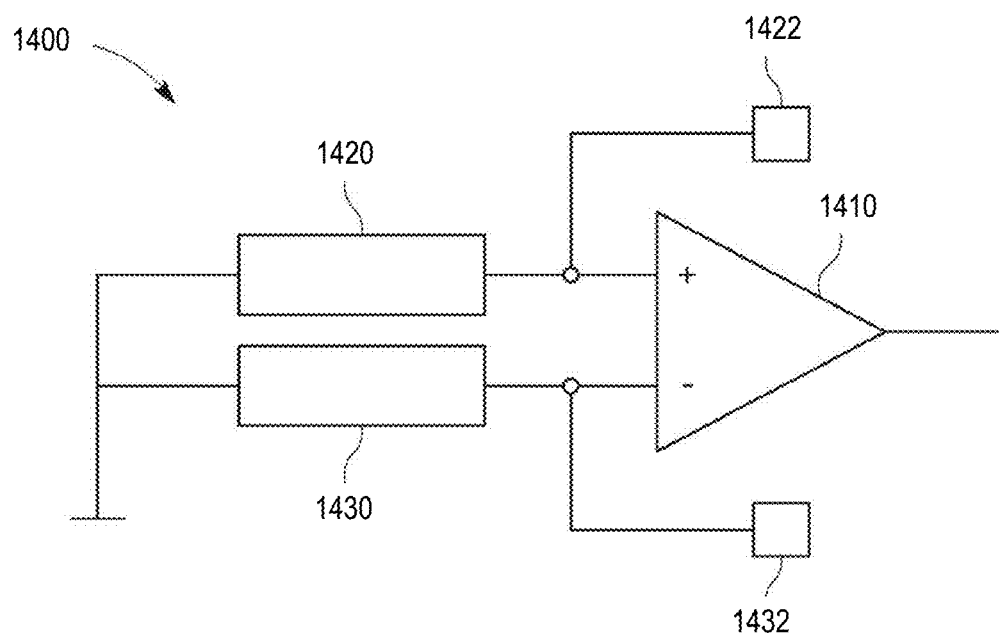
FIG. 14 illustrates upstream offset measurement in accordance with some embodiments.
Figure 15:
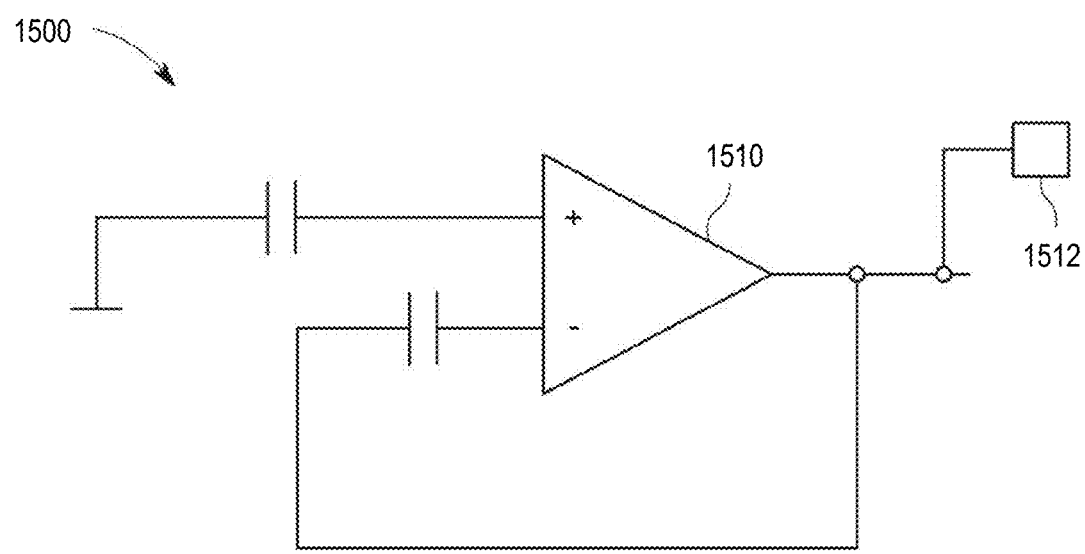
FIG. 15 illustrates self-offset measurement according to some embodiments.

According to some embodiments, offset correction may be split into an upstream offset measurement step followed by a self-offset measurement and correction step. For example, FIG. 14 illustrates 1400 upstream offset measurement in accordance with some embodiments. In particular, probes 1422 and 1432 may be placed at the inputs of a comparator 1410 in connection with upstream signal chains 1420, 1430. The upstream signal chains 1420, 1430 may be encoded in the image and configured/measured in sequence to obtain the upstream offset values. An equation in the image may be used to compute the desired offset of the comparator 1410 based on the upstream signal chains' offset contribution as well as the desired threshold of the comparator 1410. Then self-offset measurement may be utilized to converge on the desired comparator offset. For example, FIG. 15 illustrates 1500 self-offset measurement according to some embodiments. The comparator has been removed from the upstream signal chain and connected to a known reference voltage and connected in feedback such that the comparator's self-offset can be measured. The comparator may include a programmable offset. In some embodiments, the programmable offset may be an electrical charge difference between two floating nodes that are coupled to other circuits via capacitors. A probe 1512 is placed at the output of a comparator 1510. The programmed offset may then be adjusted until the voltage measured at probe 1512 matches the desired value computed in the previous step. After this, the full signal chain may be reconfigured into the device, and the offset of the comparator 1510 is such that the upstream offsets from 1420 and 1430 are cancelled and the self-offset of 1410 is cancelled and the residual offset yields the comparison threshold specified in the ideal network. This process may be applied to every offset-sensitive node in the signal chain as the signal chain is configured into the reconfigurable analog device. For example, in the signal chain 700, offset correction may be applied to each offset-sensitive nonlinear element, such as the logarithms, neural net activations, and comparators.

The accuracy of offset trimming may be subject to the settling duration of the upstream signal chain. For example, in signal chain 700, the lowpass filters (with a low frequency of 9 Hz and a correspondingly long settling time constant) are upstream of the neural net activations and upstream of the comparators. Therefore, the upstream offset measurements for these elements may require a long delay while awaiting return to quiescent state after configuration. Some embodiments may reduce this delay via a settling acceleration mechanism that increases the bias current of all upstream devices such that they operate with a shorter time constant for faster settling and then converging the bias to the ultimate value so that the quiescent point is maintained in a controlled manner. Consequently, offsets may be trimmed much faster.

Loading for trimming may involve trimming global or peripheral characteristics, a first-pass top-level analog parameter write to analog NVM, adjusting gains (e.g., measuring gains and nudging), adjusting offsets (e.g., measuring upstream, measuring self-offset, and nudging), accelerating settling (e.g., 20x bias current for 20 ms), configuring the final signal chain switches, etc.

Figure 16:
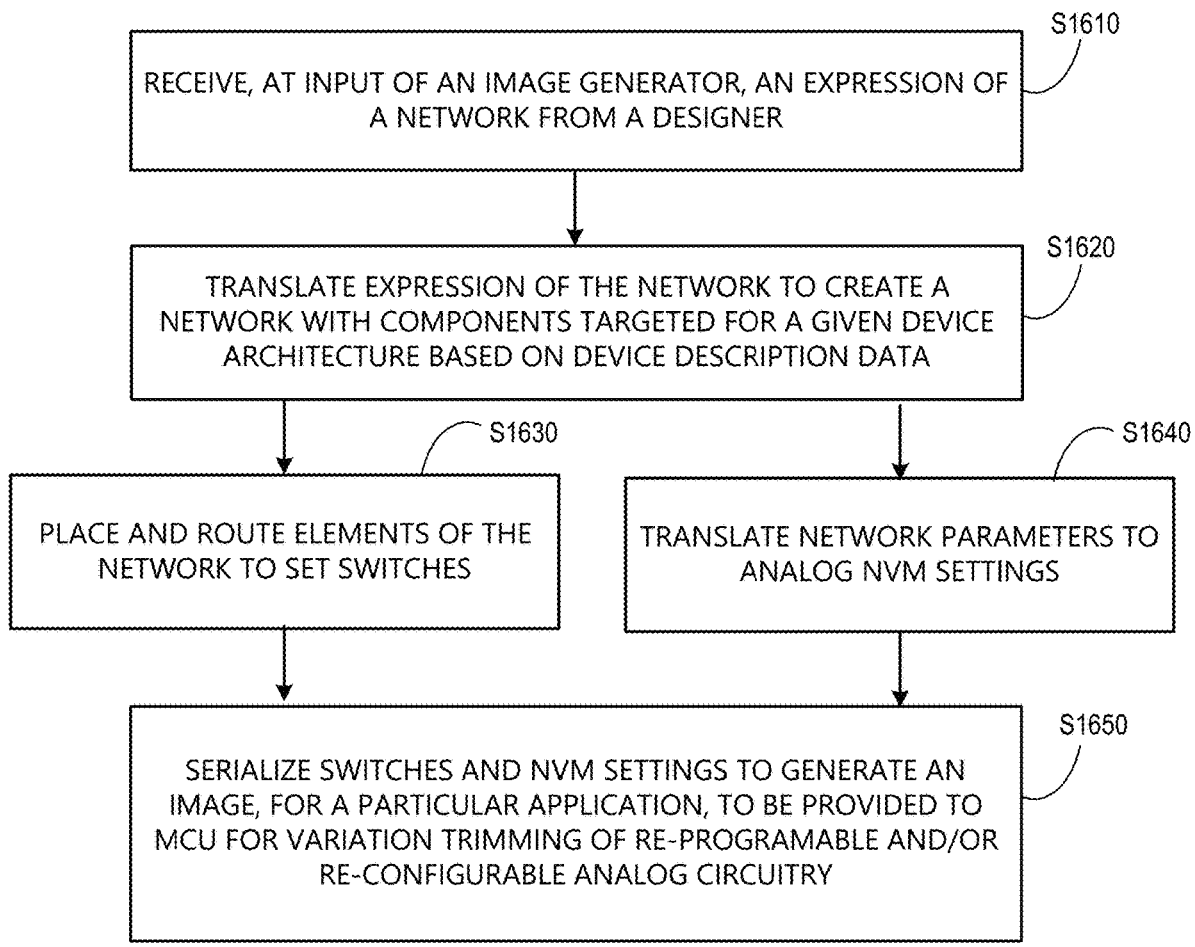
FIG. 16 is an image generation method according to some embodiments.

FIG. 16 is trimming image generation method according to some embodiments. At S1610, an input of an image generator may receive an expression of a network from a designer. At S1620, the expression of the network is translated to create a network with components for a target device architecture based on device description data. At S1630, the image generator may place and route elements of the network to set switches. At S1640, the network's parameters are translated to analog circuit parameters in analog NVM. The switches and NVM settings are then serialized at S1650 to generate an image, for a particular application, to be provided to a MCU for variation trimming of re-programmable and/or reconfigurable analog circuitry.

As used herein, the term "FPAA" may refer to, for example, any device that contains re-programmable and/or re-configurable analog circuitry. The device may also be augmented with re-programmable and/or re-configurable digital circuitry. The circuitry may be typically arranged in a re-configurable matrix of re-programmable circuit blocks. Note, however, that other architectures may also be within the spirit of this invention, such as architectures that are re-programmable but not re-configurable, architectures that are re-configurable but not re-programmable, architectures in which the circuit blocks are re-configurable (and thus are not placed in a re-configurable matrix), and/or architectures in which the re-configurable matrix itself is re-programmable. Furthermore, a matrix of circuit blocks may be scaled to any size and may consist of identical or varying types of circuit blocks. The function of the device may be modified to provide various capabilities such as sensor interfacing, signal conditioning, signal processing, event detection, wake-up generation, etc.

Embodiments have been described herein solely for the purpose of illustration. Persons skilled in the art will recognize from this description that embodiments are not limited to those described but may be practiced with modifications and alterations limited only by the spirit and scope of the appended claims.

What is claimed is:

1. A system, comprising:
   re-programmable and/or reconfigurable analog circuitry; and
   an image interpreter running in a Micro Control Unit ("MCU") and configured to receive and store an image, generated for a particular application, to facilitate variation trimming of the re-programmable and/or reconfigurable analog circuitry.

2. The system of claim 1, wherein the variation trimming is performed during production of the re-programmable and/or reconfigurable analog circuitry.

3. The system of claim 1, wherein the variation trimming is performed post-production of the re-programmable and/or reconfigurable analog circuitry, in the field, after the circuitry is provided to a customer.

4. The system of claim 1, wherein the image interpreter runs as a firmware library in an MCU further including:
   drivers associated with a control interface for the re-programmable and/or reconfigurable analog circuitry, and
   client logic coupled to the firmware library and drivers.

5. The system of claim 4, further comprising:
   the image generator, including:
   an input to receive an expression of a network from a designer, and
   a translation element to create a network with elements for a target device architecture based on device description data.

6. The system of claim 5, wherein the expression of the network is associated with at least one of: (i) a signal chain, (ii) a non-linear signal chain, and (iii) a child network.

7. The system of claim 5, wherein the network has terminals, parameters, and properties.

8. The system of claim 7, wherein at least one parameter is associated with a gain and at least one property is associated with a discrete inverting indication.

9. The system of claim 5, wherein the image generator further places and routes elements of the network to set switches and translates network parameters to analog quantities, wherein the switches and analog quantities are serialized to generate the image for the particular application that is provided to the MCU.

10. The system of claim 1, wherein the image for the particular application comprises a binary blob file that describes a configuration for a network.

11. The system of claim 1, wherein the variation trimming is associated with at least one of: (i) a global value, (ii) a peripheral value, (iii) a reference voltage VREF, (iv) a reference current IREF, (v) Non-Volatile Memory ("NVM") programming, (vi) a control Digital-to-Analog Converter ("DAC"), and (vii) write and erase rates.

12. The system of claim 1, wherein the variation trimming is associated with at least one of: (i) amplifier gains, (ii) neural net weights, (iii) filter frequency, and (iv) pulse duration.

13. The system of claim 1, wherein the re-programmable and/or reconfigurable analog circuitry comprises a Field-Programmable Analog Array ("FPAA") with a plurality of computational analog blocks configured to process a signal.

14. A method, comprising:
receiving, at a Micro Control Unit ("MCU"), an image generated for a particular application to facilitate offset trimming of re-programmable and/or reconfigurable analog circuitry;
storing the received image; and
trimming the re-programmable and/or reconfigurable analog circuitry based on the image.

15. The method of claim 14, wherein the offset trimming is performed during production of the re-programmable and/or reconfigurable analog circuitry.

16. The method of claim 14, wherein the offset trimming is performed post-production of the re-programmable and/or reconfigurable analog circuitry, in the field, after the circuitry is provided to a customer.

17. The method of claim 14, wherein the image for the particular application comprises a binary blob file that describes a configuration for a network.

18. A method, comprising:
receiving, at an input of an image generator, an expression of a network from a designer;
translating the expression of the network to create a network with elements for a target device architecture based on device description data;
placing and routing elements of the network to set switches;
translating network's parameters to analog quantities; and
serializing the switches and analog quantities to generate an image, for a particular application, to be provided to a Micro Control Unit ("MCU") for variation trimming of re-programmable and/or reconfigurable analog circuitry.

19. The method of claim 18, wherein the expression of the network is associated with at least one of: (i) a signal chain, (ii) a non-linear signal chain, and (iii) a child network.

20. The method of claim 18, wherein the network has terminals, parameters, and properties.

21. The method of claim 18, wherein the image for the particular application comprises a binary blob file that describes a configuration for the network.

22. The method of claim 18, wherein the variation trimming is associated with at least one of: (i) a global value, (ii) a peripheral value, (iii) a reference voltage VREF, (iv) a reference current IREF, (v) Non-Volatile Memory ("NVM") programming, (vi) a control Digital-to-Analog Converter ("DAC"), and (vii) write and erase rates.

23. The method of claim 18, wherein the variation trimming is associated with at least one of: (i) amplifier gains, (ii) neural net weights, (iii) filter frequency, and (iv) pulse duration.

* * * * *